US010211175B2

(12) United States Patent
Indyk et al.

(10) Patent No.: US 10,211,175 B2
(45) Date of Patent: Feb. 19, 2019

(54) STRESS-RESILIENT CHIP STRUCTURE AND DICING PROCESS

(71) Applicants: International Business Machines Corporation, Armonk, NY (US); DISCO Corporation, Tokyo (JP)

(72) Inventors: Richard F. Indyk, Wappingers Falls, NY (US); Ian D. Melville, Highland, NY (US); Shigefumi Okada, Raleigh, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 207 days.

(21) Appl. No.: 13/689,805

(22) Filed: Nov. 30, 2012

(65) Prior Publication Data
US 2014/0151879 A1 Jun. 5, 2014

(51) Int. Cl.
*H01L 23/00* (2006.01)
*H01L 21/782* (2006.01)
(Continued)

(52) U.S. Cl.
CPC .............. *H01L 24/09* (2013.01); *H01L 21/78* (2013.01); *H01L 21/782* (2013.01);
(Continued)

(58) Field of Classification Search
CPC ....... H01L 2221/68327; H01L 2224/97; H01L 21/561; H01L 21/78; H01L 24/95
(Continued)

(56) References Cited

U.S. PATENT DOCUMENTS 6,498,074 B2 12/2002 Siniaguine et al.
6,924,210 B1 8/2005 Daubenspeck et al.
(Continued)

FOREIGN PATENT DOCUMENTS

JP 2002100703 A 4/2002
JP 2004111606 A 4/2004
(Continued)

OTHER PUBLICATIONS

U.S. Office Action dated Jan. 22, 2015 received in U.S. Appl. No. 14/485,207.
(Continued)

*Primary Examiner* — Thao X Le
*Assistant Examiner* — Geoffrey Ida
(74) *Attorney, Agent, or Firm* — Scully, Scott, Murphy & Presser, P.C.; Steven J. Meyers

(57) ABSTRACT

A substrate includes a plurality of semiconductor chips arranged in a grid pattern and laterally spaced from one another by channel regions. The substrate includes a vertical stack of a semiconductor layer and at least one dielectric material layer embedding metal interconnect structures. The at least one dielectric material layer are removed along the channel regions and around vertices of the grid pattern so that each semiconductor chip includes corner surfaces that are not parallel to lines of the grid pattern. The corner surfaces can include straight surfaces or convex surfaces. The semiconductor chips are diced and subsequently bonded to a packaging substrate employing an underfill material. The corner surfaces reduce mechanical stress applied to the metal interconnect layer during the bonding process and subsequent thermal cycling processes.

13 Claims, 10 Drawing Sheets

(51) Int. Cl.
  *H01L 23/492* (2006.01)
  *H01L 21/78* (2006.01)
  *H01L 21/56* (2006.01)

(52) U.S. Cl.
  CPC .......... *H01L 23/492* (2013.01); *H01L 23/562* (2013.01); *H01L 24/17* (2013.01); *H01L 24/95* (2013.01); *H01L 21/561* (2013.01); *H01L 24/94* (2013.01); *H01L 2224/0401* (2013.01); *H01L 2224/0901* (2013.01); *H01L 2224/0905* (2013.01); *H01L 2224/16225* (2013.01); *H01L 2224/17104* (2013.01); *H01L 2224/32225* (2013.01); *H01L 2224/73204* (2013.01); *H01L 2224/94* (2013.01); *H01L 2924/014* (2013.01); *H01L 2924/12042* (2013.01)

(58) Field of Classification Search
  USPC ........................................................ 257/738
  See application file for complete search history.

(56) References Cited

U.S. PATENT DOCUMENTS

| | | | |
|---|---|---|---|
| 7,648,891 B2 | 1/2010 | Farooq et al. | |
| 2001/0045419 A1* | 11/2001 | Dunsky ................. | B23K 26/02 219/121.76 |
| 2002/0098620 A1* | 7/2002 | Ding ..................... | H01L 21/563 438/113 |
| 2002/0173074 A1* | 11/2002 | Chun-Jen et al. ........... | 438/108 |
| 2003/0121511 A1* | 7/2003 | Hashimura ......... | H01L 21/3043 125/2 |
| 2004/0048037 A1 | 3/2004 | Klausmann et al. | |
| 2004/0147064 A1 | 7/2004 | He | |
| 2004/0188696 A1 | 9/2004 | Hsing Chen et al. | |
| 2005/0164429 A1* | 7/2005 | Kinsman ............... | H01L 21/561 438/113 |
| 2006/0024924 A1* | 2/2006 | Haji .................... | H01L 21/6835 438/464 |
| 2006/0068567 A1 | 3/2006 | Beyne et al. | |
| 2006/0131590 A1* | 6/2006 | Takakura et al. ............... | 257/79 |
| 2008/0150087 A1* | 6/2008 | Farooq et al. ............... | 257/620 |
| 2008/0265445 A1* | 10/2008 | Feger .................... | H01L 21/563 257/797 |
| 2009/0200662 A1 | 8/2009 | Ng | |
| 2011/0008918 A1 | 1/2011 | Shum et al. | |
| 2011/0024781 A1* | 2/2011 | Fujimoto et al. ............... | 257/98 |
| 2011/0227201 A1 | 9/2011 | Too et al. | |

FOREIGN PATENT DOCUMENTS

| | | |
|---|---|---|
| JP | 2007027699 A | 2/2007 |
| JP | 2008130700 A | 6/2008 |

OTHER PUBLICATIONS

Office Action dated Apr. 8, 2016 received in U.S. Appl. No. 14/485,207.

U.S. Office Action dated Oct. 25, 2016 received in U.S. Appl. No. 14/485,207.

* cited by examiner

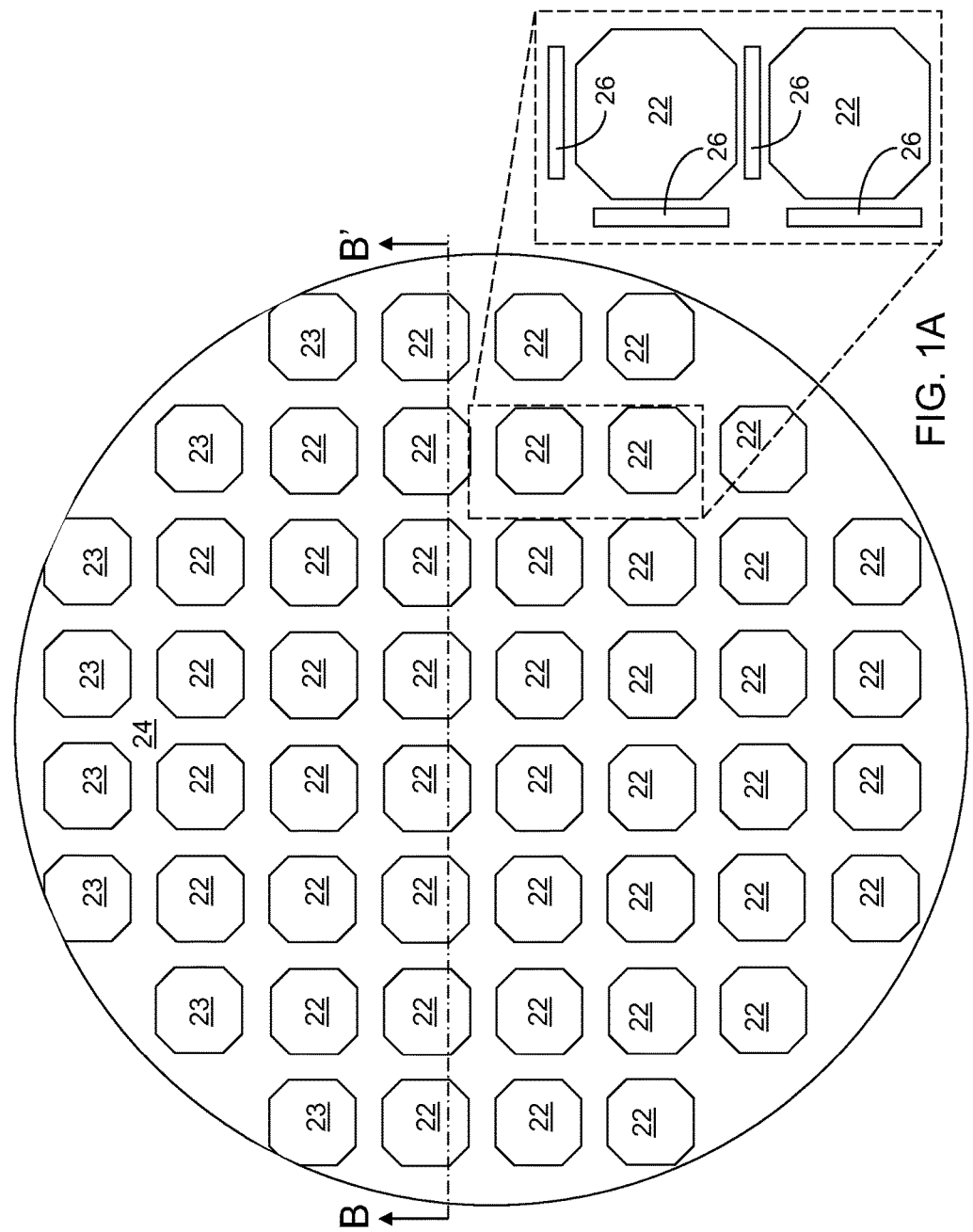

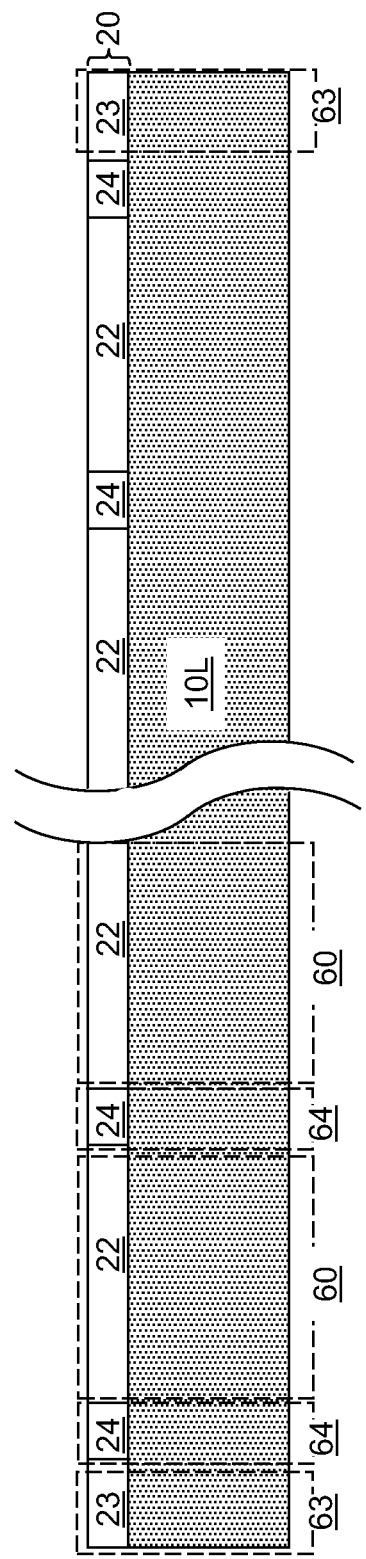

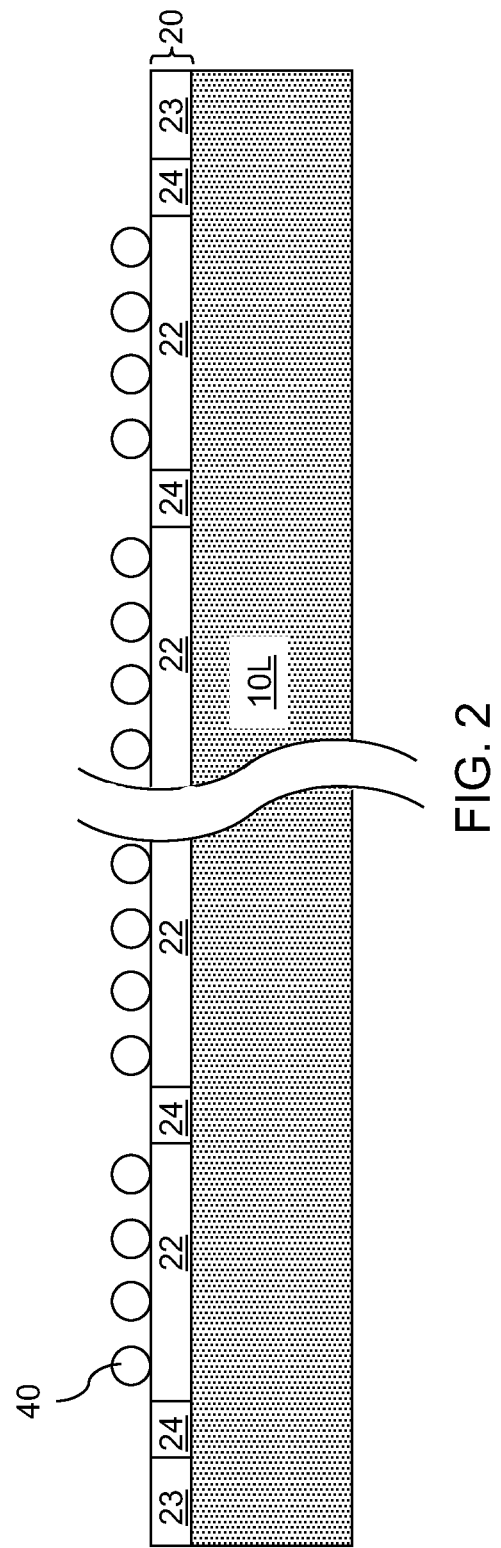

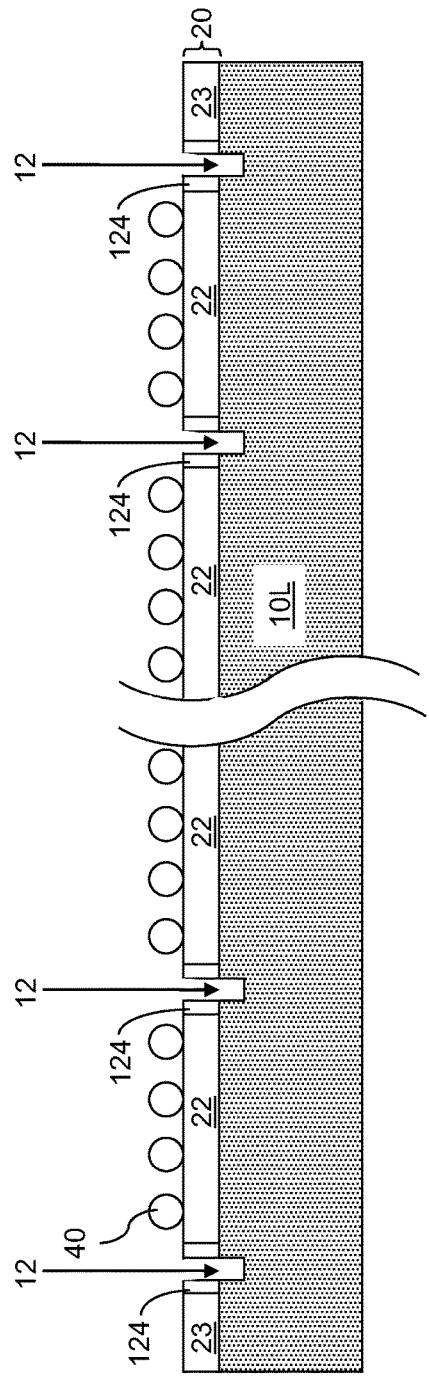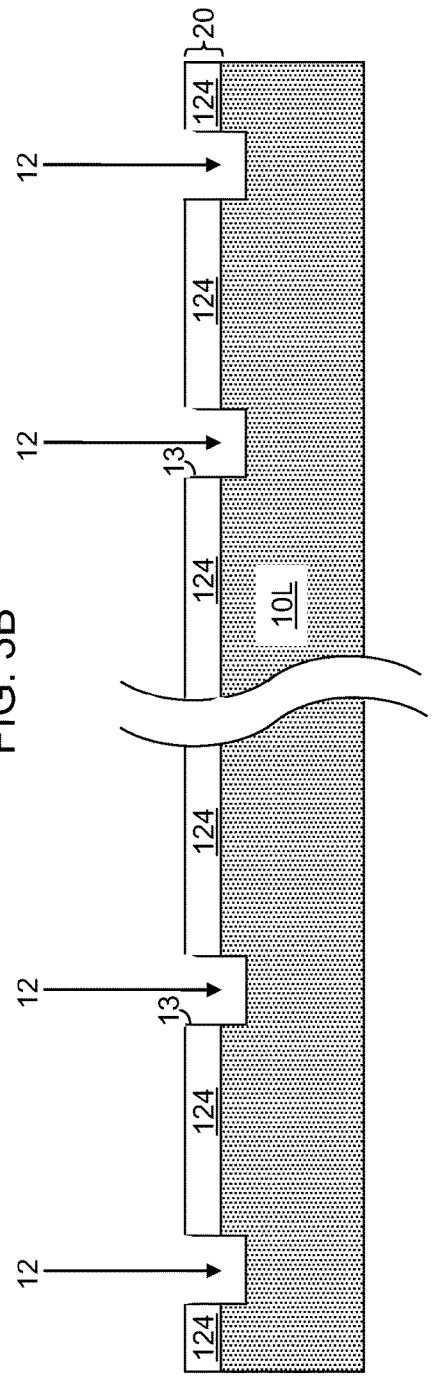

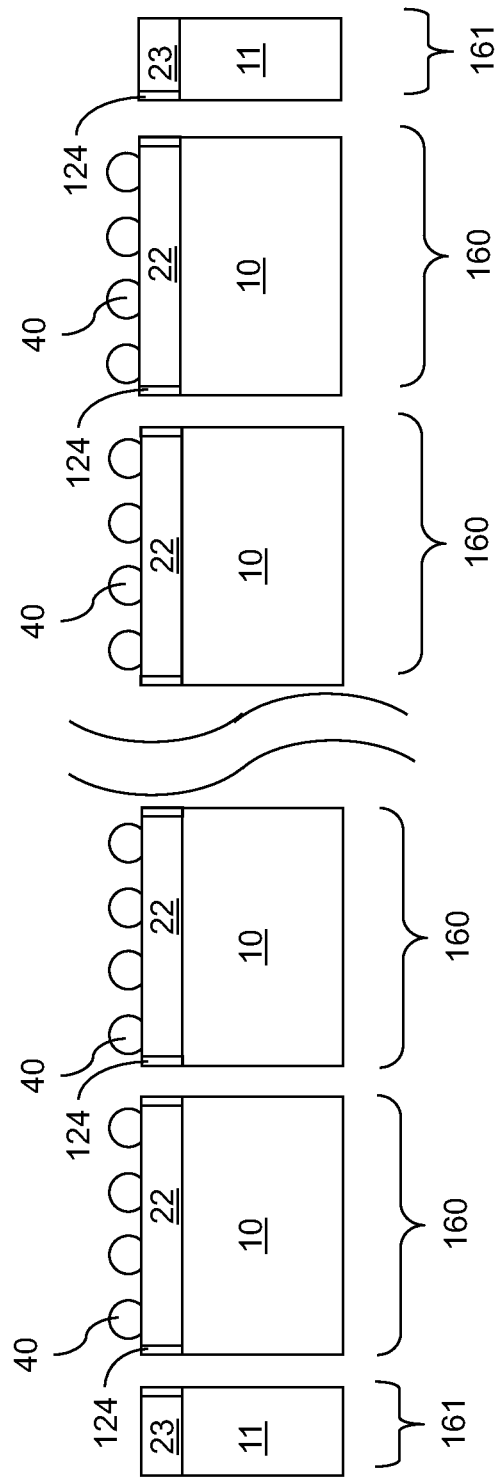

STRESS-RESILIENT CHIP STRUCTURE AND DICING PROCESS

BACKGROUND

The present disclosure relates to substrate dicing, and particularly, to a method of dicing a substrate for reduction of stress on diced chips, and structures formed by the same.

Dicing is a process in which a chip-containing substrate wafer is cut into individual die. The chip-containing substrate typically includes a vertical stack of a semiconductor structures including semiconductor devices and a metal interconnect structure-containing layer including dielectric material layers and metal interconnect structures embedded therein. Each die typically includes a semiconductor chip, and can be subsequently bonded with another substrate in a bonding process such as flip chip assembly. Typically, a diamond blade dicing process has been used in the industry for singulation of dies from the chip-containing substrate.

Recently, low dielectric constant (low-k) dielectric materials having a dielectric constant less than 3.9 (the dielectric constant of silicon oxide) and porous ultra low-k dielectric materials having a dielectric constant less than 2.8 have been employed as the dielectric material embedding the metal interconnect structures in chip-containing substrates. Because such low-k and ultra low-k dielectric materials are prone to structural damage during saw dicing, formation of grooves in the dielectric material layer embedding metal interconnect structures has been recently adopted. Specifically, a laser grooving process can be performed first on the active side of the chip-containing substrate, i.e., the side at which the dielectric material layer embedding metal interconnect structures are located. Low-k and/or ultra low-k dielectric material layers and metallic structures in the dicing channels are ablated by a laser beam. The metallic structures in the dicing channels typically include test structures and alignment structures, and are referred to as kerf structures. Full singulation of the dies is accomplished by cutting through the remaining portion of the chip-containing substrate, i.e., the semiconductor substrate, in the dicing streets with a diamond saw process.

The low-k and/or ultra low-k dielectric material layers in the metal interconnect layer have a lower mechanical strength than silicon oxide or silicon nitride employed in prior generation semiconductor chips. Thus, diced semiconductor chips including low-k and/or ultra low-k dielectric material layers are more prone to structural damage such as cracking during subsequent packaging steps, which include, for example, thermal cycling steps employed during bonding of a semiconductor chip to a packaging substrate.

BRIEF SUMMARY

A substrate includes a plurality of semiconductor chips arranged in a grid pattern and laterally spaced from one another by channel regions. The substrate includes a vertical stack of a semiconductor layer and at least one dielectric material layer embedding metal interconnect structures. The at least one dielectric material layer is removed along the channel regions and around vertices of the grid pattern so that each semiconductor chip includes corner surfaces that are not parallel to lines of the grid pattern. The corner surfaces can include straight surfaces or convex surfaces. The semiconductor chips are diced and subsequently bonded to a packaging substrate employing an underfill material. The corner surfaces can reduce mechanical stress applied to the metal interconnect layer during the bonding process and subsequent thermal cycling processes.

According to an aspect of the present disclosure, a method of manufacturing a semiconductor structure is provided. At least one dielectric material layer embedding metal semiconductor structures is formed on a semiconductor substrate. A plurality of semiconductor chips and inter-chip regions are thus formed. Each of the plurality of semiconductor chips includes a portion of the semiconductor substrate and a portion of the at least one dielectric material layer, and each of the plurality of semiconductor chips is arranged in a grid pattern. Grooves are formed in the at least one dielectric layer by removing portions of the at least one dielectric material layer in the inter-chip regions. Corner surfaces can be simultaneously formed on the plurality of semiconductor chips by removal of the portions of the at least one dielectric material layer around vertices of the grid pattern. Each corner surface is not parallel to any of the two sets of parallel lines. The semiconductor substrate is diced along the grooves.

According to another aspect of the present disclosure, a semiconductor structure contains a semiconductor chip, which includes a semiconductor substrate and at least one dielectric material layer embedding metal interconnect structures. The at least one dielectric material layer includes pairs of parallel vertical surfaces and corner surfaces that are not parallel to the pairs of parallel vertical surfaces and adjoin the pairs of parallel vertical surfaces.

BRIEF DESCRIPTION OF SEVERAL VIEWS OF THE DRAWINGS

FIG. 1A is a top-down view of an exemplary semiconductor structure which includes a semiconductor substrate and at least one dielectric material layer and in which a plurality of semiconductor chips are laterally spaced by inter-chip regions according to an embodiment of the present disclosure.

FIG. 1B is a vertical cross-sectional view of the exemplary semiconductor structure along the plane B-B' in FIG. 1A.

FIG. 2 is a vertical cross-sectional view of the exemplary semiconductor structure after formation of arrays of solder balls on the plurality of semiconductor chips according to an embodiment of the present disclosure.

FIG. 3B is a vertical cross-sectional view of the exemplary semiconductor structure along the plane B-B' in FIG. 3A.

FIG. 3C is a vertical cross-sectional view of the exemplary semiconductor structure along the plane C-C' in FIG. 3A.

FIG. 5 is a schematic vertical cross-sectional view of the exemplary structure after singulation of the substrate into a plurality of semiconductor chips according to an embodiment of the present disclosure.

DETAILED DESCRIPTION

Figure 3A:
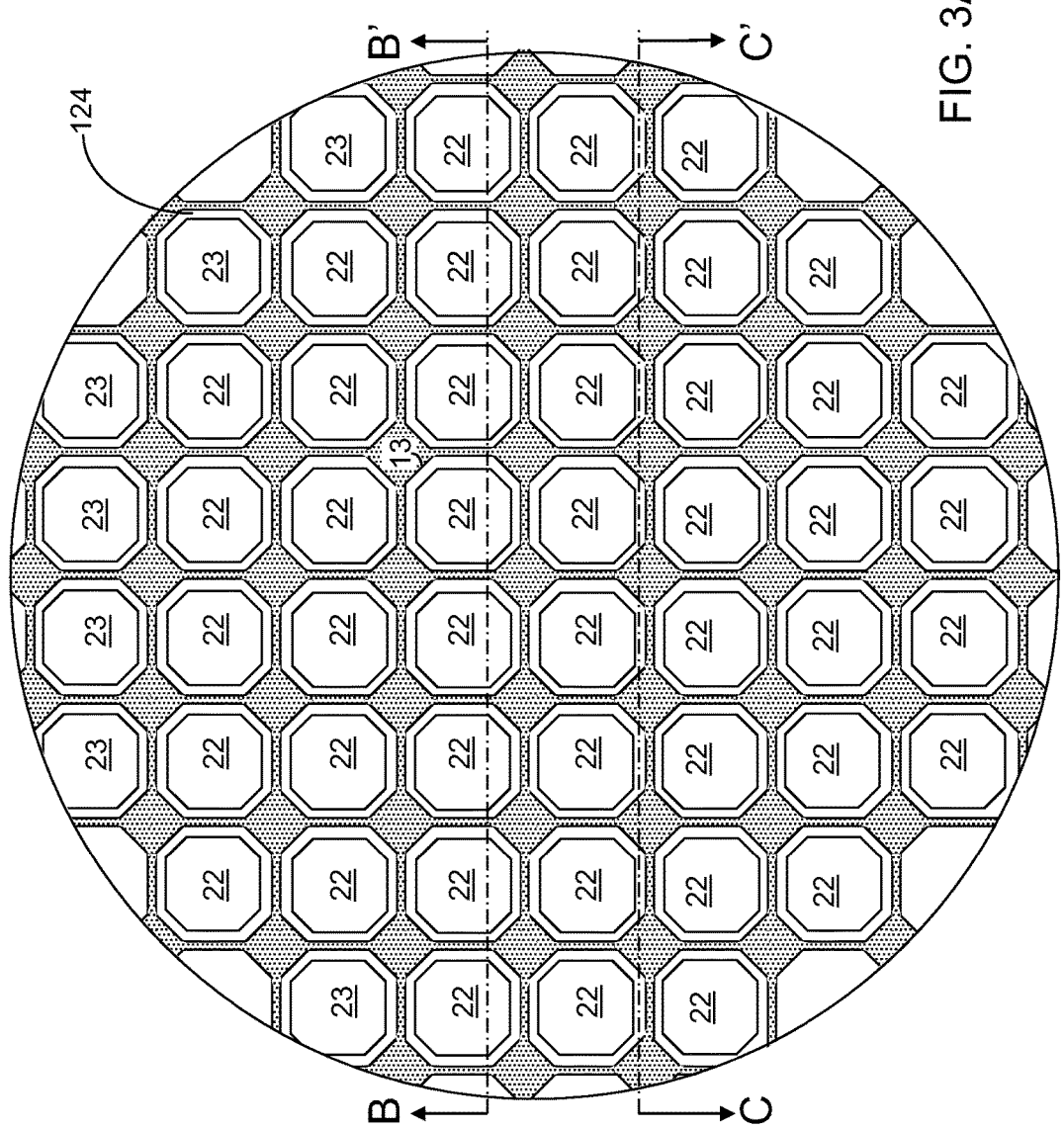
FIG. 3A is a top-down view of the exemplary structure after formation of grooves and corner surfaces by removing portions of the at least one dielectric material layer along inter-chip regions and around vertices of a grid pattern defining arrangement of the plurality of semiconductor chips according to an embodiment of the present disclosure.

As stated above, the present disclosure relates to a method of dicing a substrate for reduction of stress on diced chips, and structures formed by the same. Aspects of the method and structures are now described in detail with accompanying figures. It is noted that like and corresponding elements are referred to by like reference numerals. The drawings are not in scale.

Referring to FIGS. 1A and 1B, an exemplary semiconductor structure includes a semiconductor substrate 10L and at least one dielectric material layer 20. A plurality of semiconductor chip cores 60 are laterally spaced by inter-chip regions 64. As used herein, a "semiconductor chip" refers a contiguous structure including a set of semiconductor devices embedded or located on a portion of a semiconductor substrate and designed to be diced as an isolated functional unit. Each semiconductor chip core 60 includes a portion of the semiconductor substrate 10L and a portion of the at least one dielectric material layer 20. As used herein, "inter-chip regions" collectively refer to all regions within a stack of a semiconductor substrate and at least one dielectric material layer that do not include, or overlie, any semiconductor device to be incorporated within any full semiconductor chip or any partial semiconductor chip.

The semiconductor substrate 10L includes a semiconductor material such as silicon, germanium, a silicon-germanium alloy, or any composite semiconductor material known in the art. Semiconductor devices are formed in, and/or on, the semiconductor substrate 10L.

At least one dielectric material layer 20 embedding metal semiconductor structures therein is subsequently formed. The at least one dielectric material layer 20 can include a single dielectric material or a plurality of different dielectric materials. Metal interconnect structures (not expressly shown) such as metal lines and metal vias are formed within the at least one dielectric material layer 20. In one embodiment, the at least one dielectric material layer 20 includes a plurality of layered metal interconnect levels. Arrays of first metallic pads (not expressly shown) can be formed in the uppermost portion of the at least one dielectric material layer employing methods known in the art.

The at least one dielectric material layer 20 includes multiple regions, which include a plurality of full chip metal interconnect structure regions 22, partial chip metal interconnect structure regions 23 that are located on the periphery of the semiconductor substrate 10L and having an area less than the size of a full semiconductor chip, and inter-chip dielectric regions 24 (i.e., dicing channel regions) that are located between adjacent pairs of full or partial chip metal interconnect structure regions (22, 23). Each fully functional semiconductor chip core 60 includes a full chip metal interconnect structure region 22 and an underlying region of the semiconductor substrate 10L that includes a full set of semiconductor devices designed for providing full functionality to the semiconductor chip core 60.

In one embodiment, the at least one dielectric material layer 20 can include at least one porous dielectric material, which can be present as one or more porous dielectric material layers (not expressly shown) located within the at least one dielectric material layer 20. For example, the at least one porous dielectric material can be an organosilicate glass (OSG) material including Si, C, O, H, and optionally N, a porous dielectric organic polymer material, SiLK™, or any other porous low dielectric constant (low-k) dielectric material having a dielectric constant less than 2.8 as known in the art. Each of the at least one porous dielectric material can be formed by any method for depositing a porous dielectric material as known in the art including, but not limited to, spin-coating and chemical vapor deposition (CVD). In addition, the at least one dielectric material layer 20 can optionally include at least one non-porous dielectric material such as silicon oxide, silicon nitride, and/or silicon oxynitride.

The arrays of first metallic pads are formed in the uppermost portion of the at least one dielectric material layer 20, for example, by deposition and patterning of a metallic material. Within each semiconductor chip core 60, a set of metal interconnect structures embedded within a full chip metal interconnect structure region 22 provides electrical contact between semiconductor devices within the underlying region of the semiconductor substrate 10L and an array of first metallic pads located in the uppermost portion of the full chip metal interconnect structure region 22.

In one embodiment, the uppermost portion of the at least one dielectric material layer 20 can optionally include a protective dielectric material layer through which the arrays of first metallic pads are physically exposed. In one embodiment, the protective dielectric material layer can include a polyimide resin or an epoxy resin.

A plurality of semiconductor chip cores 60 and the inter-chip regions 64 are formed within the vertical stack of the semiconductor substrate 10L and the at least one dielectric material layer 20. Each of the plurality of semiconductor chip cores 60 includes a portion of the semiconductor substrate 10L and a portion of the at least one dielectric material layer 20. The portions of the at least one dielectric material layer in the plurality of semiconductor chip cores 60 are herein the full chip metal interconnect structure regions 22. Each partial semiconductor chip 63 includes an incomplete set of semiconductor devices that is less than a complete set of semiconductor devices designed for a semiconductor chip core 60. Each partial semiconductor chip 63 includes a peripheral portion of the semiconductor substrate 10L and an overlying portion of the at least one dielectric material layer 20, which is herein referred to as a partial chip metal interconnect structure region 23.

The inter-chip regions 64 include all portions of the semiconductor substrate 10L outside of the plurality of semiconductor chip cores 60 and the partial semiconductor chips 63. Further, the inter-chip regions 64 include all portions of the at least one dielectric layer 20 outside of the plurality of semiconductor chip cores 60 and the partial semiconductor chips 63.

In one embodiment, a grid pattern can be defined in a two-dimensional horizontal plane into which the locations of the plurality of semiconductor chip cores 60 and the partial semiconductor chips 63 are mapped. In one embodiment, the grid pattern can be defined by intersecting points of two sets of parallel lines, in which the vertices are the intersecting points.

In one embodiment, the two sets of parallel lines include a first set of parallel lines and a second set of parallel lines that are perpendicular to the first set of parallel lines. The grid pattern can be a two-dimensional array of a unit pattern. The unit pattern for the grid pattern can be defined by a set of four vertices formed by a neighboring pair of parallel lines within the first set of parallel lines and a neighboring pair of parallel lines within the second set of parallel lines. The unit pattern can be a rectangle. As used herein, a geometrical center of a semiconductor chip core 60 is defined as the geometrical center of the volume occupied by the semiconductor chip core 60, which can be calculated by calculating a set of Cartesian coordinates corresponding to the average of the Cartesian coordinates of all points within the volume occupied by the semiconductor chip core 60. In one embodiment, a center point of each unit pattern in the grid pattern can coincide with a projection of one of the geometrical centers of the plurality of semiconductor chip cores 60 onto a two-dimensional horizontal plane.

In one embodiment, the inter-chip regions 64 can be located on the two sets of parallel lines, i.e., the two sets of parallel lines can pass through the inter-chip regions 64. Each of the plurality of semiconductor chip cores 60 is laterally spaced from one another by the inter-chip regions 64. The inter-chip regions 60 can include physical structures including test structures and/or alignment structures. Such physical structures are herein referred to as kerf structures 26.

Each semiconductor chip cores 60 can have a same horizontal cross-sectional area. In on embodiment, the semiconductor chip cores 60 can have an octagonal horizontal cross-sectional shape such that four of the eight sides of the octagonal cross-sectional shape are parallel to the first set of parallel lines or the second set of parallel lines that define a rectangular grid, and the other four of the eight sides of the octagonal cross-sectional shape are not parallel to the first set of parallel lines or the second set of parallel lines.

Referring to FIG. 2, an array of solder balls 40 is formed on each array of first metallic pads (not shown) that overlie the metal interconnect structures embedded within the at least one dielectric material layer 20. Each solder ball 40 is formed on a first metallic pad employing methods known in the art. The array of solder balls 40 is formed over the at least one dielectric material layer 20. In one embodiment, the shape of the solder balls 40 can be spherical, cylindrical, or polygonal. The solder balls 40 can include for example, at least two elements selected from tin, silver, gold, lead, zinc, bismuth, indium, and copper.

The lateral dimension of the first metallic pads can be on the order of about 100 microns. The height of the solder balls 40 can be on the order of about 100 microns. The solder balls 40 can be formed only over the full chip metal interconnect structure regions 22, or over the full chip metal interconnect structure regions 22 and the partial chip metal interconnect structure regions 23.

Referring to FIGS. 3A, 3B, and 3C, grooves 12 are formed by removing portions of the at least one dielectric material layer 20 within the inter-chip regions 64. Further, corner surfaces 13 are formed by removing portions of the at least one dielectric material layer 20 around vertices of the grid pattern defining arrangement of the plurality of semiconductor chip cores 60. Solder balls 40 are not shown in FIG. 3A for clarity.

The grooves 12 are formed the dielectric material layer 20 and optionally through an upper portion of the semiconductor substrate 10 by laser irradiation. The grooves 12 can be formed through the dielectric material layer 20 by removing center portions of the inter-chip dielectric regions 24 selective to the full chip metal interconnect structure regions 22 and the partial chip metal interconnect structure regions 23. In other words, the full chip metal interconnect structure regions 22 and the partial chip metal interconnect structure regions 23 are not removed by the laser irradiation. Thus, the grooves 12 are formed along dicing channels of the semiconductor substrate 10L that correspond to lateral boundaries between adjacent pairs of full or partial semiconductor chip cores 60.

In one embodiment, the grooves 12 can be formed along the two sets of parallel lines that define the grid pattern such that a peripheral dielectric portion 124 laterally surrounds each full chip metal interconnect structure regions 22. In this case, the grooves 12 can be formed with a width that is less than the lateral separation distance of a neighboring pair of semiconductor chip cores 60 in regions in which the neighboring pair of semiconductor chip cores 60 has a pair edges that is parallel to one of the two pairs of parallel lines that define the grid pattern.

Each groove 12 can extend from a portion of a periphery located one side of the semiconductor substrate 10L to another portion of the periphery located at an opposite side of the semiconductor substrate 10L. Formation of each groove 12 can be performed by a single scanning of laser irradiation over the region of the groove 12, or can be performed by repeating laser irradiation for a plurality of times.

In one embodiment, the grooves 12 can be arranged in a lattice pattern. In one embodiment, each groove 12 can extend from one end to another end. The grooves 12 are arranged, for example, in a lattice pattern.

The peripheral dielectric portions 124 are formed with corner surfaces 13, which are formed around vertices of the grid pattern. The corner surfaces 13 are formed by widening the width of the grooves 12 at each vertex that defines the grid pattern. Each corner surface 13 is not parallel to any of the two sets of parallel lines. Each corner surface 13 can be substantially vertical. The widening of the grooves 12 for formation of the corner surfaces 13 is controlled such that the peripheral dielectric portions 124 are not thinned through to physically expose sidewalls of the full chip metal interconnect structure regions 22.

If the semiconductor chip cores 60 have an octagonal horizontal cross-sectional shape, the corner surfaces 13 can be within 2-dimensional planar vertical planes that are not parallel to the first set of parallel lines or the second set of parallel lines. If the semiconductor chip cores 60 have a horizontal cross-sectional shape of a rounded rectangle, the corner surfaces 13 can be within curved vertical planes.

In one embodiment, the removal of portions of the inter-chip dielectric regions 24 around each vertices of the grid pattern can be performed by modifying the path of a laser beam from a linear path to a non-linear path that deviates from a line within the two sets of parallel lines by adding additional segments around the vertices of the grid pattern.

Figure 3E:
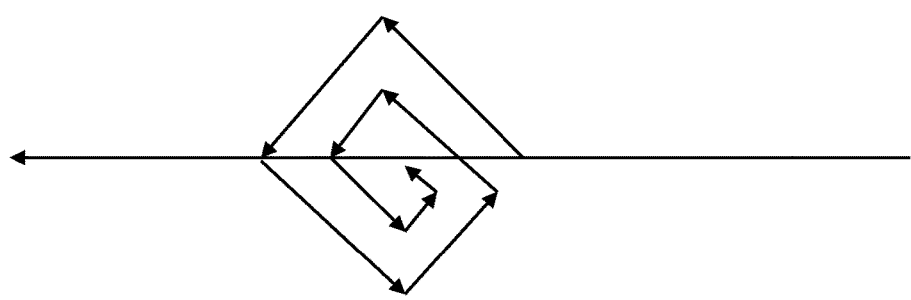
FIG. 3E is a second exemplary laser beam scanning pattern for formation of corner surfaces.
Figure 3D:
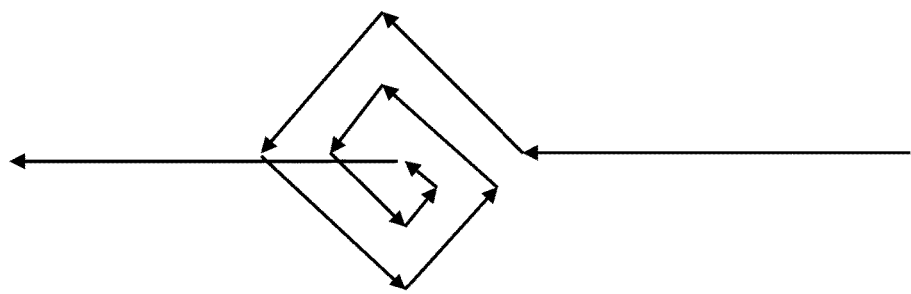
FIG. 3D is a first exemplary laser beam scanning pattern for formation of corner surfaces.

A first exemplary laser beam scanning pattern for formation of corner surfaces 13 is illustrated in FIG. 3D.

In another embodiment, the removal of portions of the inter-chip dielectric regions 24 around each vertices of the grid pattern can be performed by adding an additional laser ablation path to straight paths for the laser beam that forms a groove 12 of a constant width. Additional portions of the inter-chip dielectric regions 24 are removed from around each vertex of the grid pattern by the added beam paths that can run around each vertex. Optionally, the added beam paths can have a spiral pattern in which the distance of the laser beam is increased or decreased in time. A second exemplary laser beam scanning pattern for formation of corner surfaces 13 is illustrated in FIG. 3E.

The corner surfaces 13 can be planar vertical surfaces that are not parallel to lines connecting the vertices of the grid pattern, i.e., the two sets of parallel lines that define the grid pattern. Remaining portions of the at least one dielectric material layer 20 over a semiconductor chip core 60 for a full semiconductor chip can have an octagonal horizontal cross-sectional shape after the forming of the corner surfaces 13. The remaining portions of the at least one dielectric material layer 20 include a full chip metal interconnect structure region 22 and a peripheral dielectric portion 124.

Figure 4A:
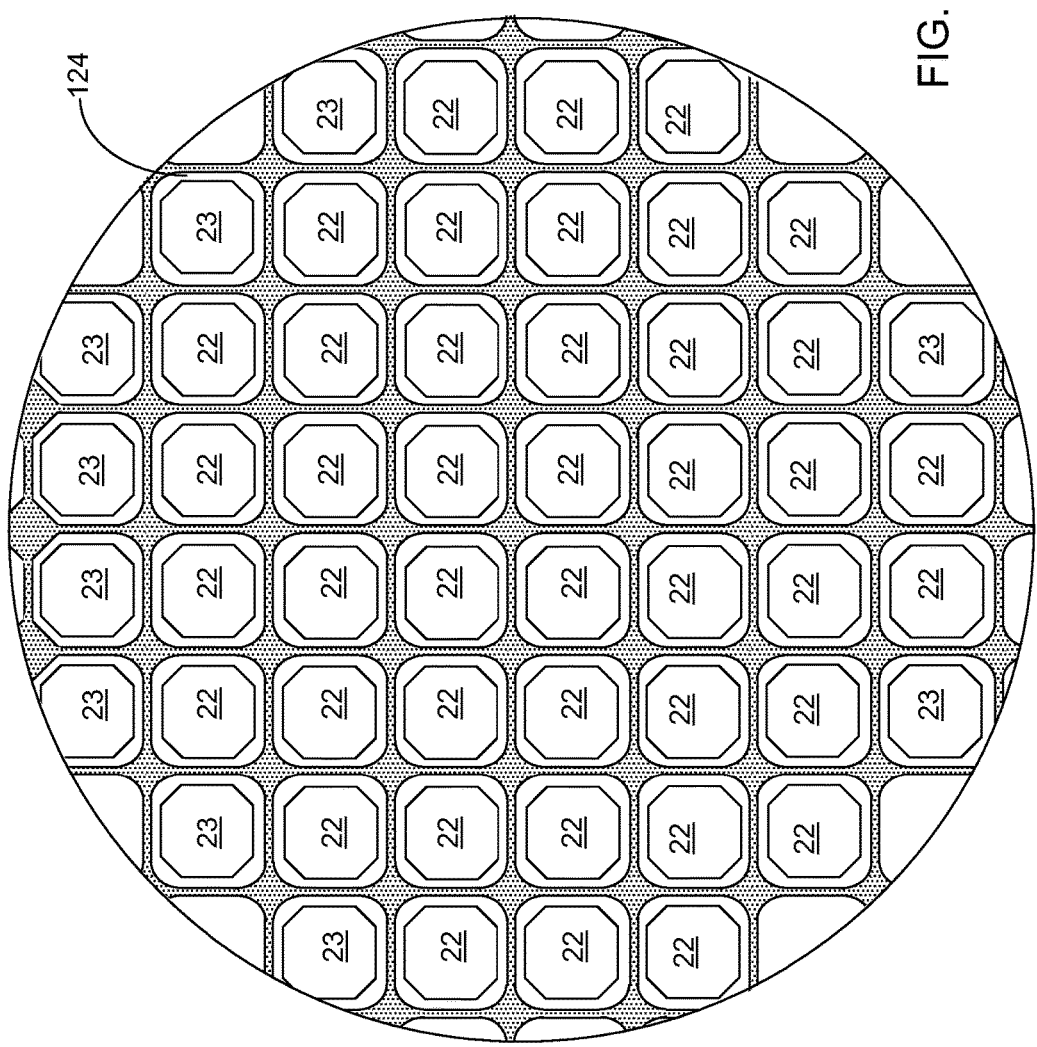
FIG. 4A is a top-down view of a variation of the exemplary structure after formation of grooves and corner surfaces by removing portions of the at least one dielectric material layer along inter-chip regions and around vertices of a grid pattern defining arrangement of the plurality of semiconductor chips according to an embodiment of the present disclosure.

Referring to FIG. 4A, a variation of the exemplary structure is show, which can be formed by modifying the shapes of the peripheral dielectric portions 124. Grooves 12 are formed by removing portions of the at least one dielectric material layer 20 within the inter-chip regions 64 in the same manner as described above. Further, corner surfaces 13 are formed by removing portions of the at least one dielectric material layer 20 around vertices of the grid pattern defining arrangement of the plurality of semiconductor chip cores 60. Solder balls 40 are not shown in FIG. 4A for clarity.

In one embodiment, the grooves 12 can be arranged in a lattice pattern. In one embodiment, each groove 12 can extend from one end to another end. The grooves 12 are arranged, for example, in a lattice pattern.

The peripheral dielectric portions 124 are formed with corner surfaces 13, which are formed around vertices of the grid pattern. The corner surfaces 13 are formed by widening the width of the grooves 12 at each vertex that defines the grid pattern. Each corner surface 13 is not parallel to any of the two sets of parallel lines. Each corner surface 13 can be substantially vertical. The widening of the grooves 12 for formation of the corner surfaces 13 is controlled such that the peripheral dielectric portions 124 are not thinned through to physically expose sidewalls of the full chip metal interconnect structure regions 22.

If the semiconductor chip cores 60 have an octagonal horizontal cross-sectional shape, the corner surfaces 13 can be within 2-dimensional planar vertical planes that are not parallel to the first set of parallel lines or the second set of parallel lines. If the semiconductor chip cores 60 have an octagonal horizontal cross-sectional shape, the corner surfaces 13 can be within curved vertical planes.

In one embodiment, the outer surfaces of at least one peripheral dielectric portion 124 can have a horizontal cross-sectional shape of a rounded rectangle, i.e., a geometrical shape by substituting four corners of a rectangle by four arcs, such that four sides of the cross-sectional shape are parallel to the first set of parallel lines or the second set of parallel lines that define a rectangular grid. In one embodiment, each of the four arcs can be convex, i.e., having a center of curvature within a quadrant that includes the peripheral dielectric portion 124 among the four quadrants defined by the intersection of the extensions of the two sides of the horizontal cross-sectional shape to which the arc is adjoined to. Thus, the convex surfaces 13 can be convex vertical surfaces.

Figure 4C:
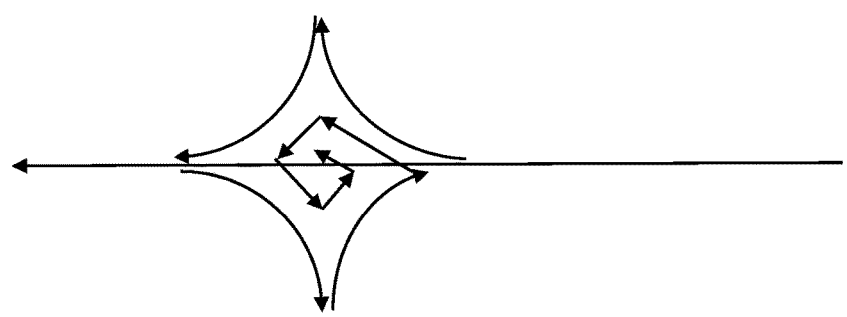
FIG. 4C is a fourth exemplary laser beam scanning pattern for formation of corner surfaces.
Figure 4B:
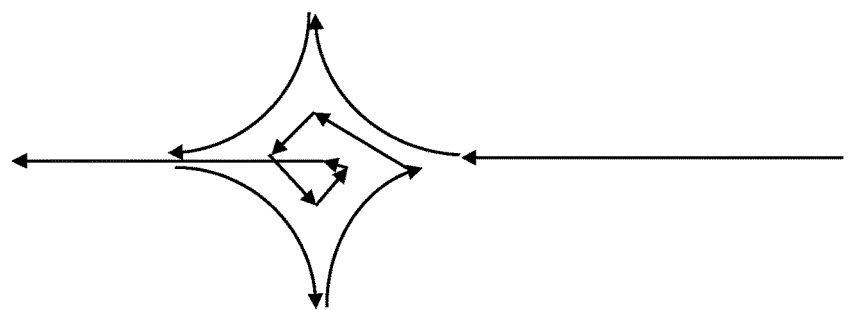
FIG. 4B is a third exemplary laser beam scanning pattern for formation of corner surfaces.

In one embodiment, the removal of portions of the inter-chip dielectric regions 24 around each vertices of the grid pattern can be performed by modifying the path of a laser beam from a linear path to a non-linear path that deviates from a line within the two sets of parallel lines by adding additional segments around the vertices of the grid pattern. A third exemplary laser beam scanning pattern for formation of corner surfaces 13 is illustrated in FIG. 4B.

In another embodiment, the removal of portions of the inter-chip dielectric regions 24 around each vertices of the grid pattern can be performed by adding an additional laser ablation path to straight paths for the laser beam that forms a groove 12 of a constant width. Additional portions of the inter-chip dielectric regions 24 are removed from around each vertex of the grid pattern by the added beam paths that can run around each vertex. Optionally, the added beam paths can have a spiral pattern in which the distance of the laser beam is increased or decreased in time. A fourth exemplary laser beam scanning pattern for formation of corner surfaces 13 is illustrated in FIG. 4C.

The corner surfaces 13 can be planar vertical surfaces that are not parallel to lines connecting the vertices of the grid pattern, i.e., the two sets of parallel lines that define the grid pattern. Remaining portions of the at least one dielectric material layer 20 over a semiconductor chip core 60 for a full semiconductor chip can have a horizontal cross-sectional shape of a rounded rectangle after the forming of the corner surfaces 13. The remaining portions of the at least one dielectric material layer 20 over each semiconductor chip core 60 include a full chip metal interconnect structure region 22 and a peripheral dielectric portion 124.

Referring to FIG. 5, the semiconductor substrate 10L is diced along the grooves 12 to form a plurality of semiconductor chips 160. Each of the plurality of semiconductor chips 160 includes a full chip semiconductor portion 10 and overlying portions of the at least one dielectric material layer 20, which have vertical surfaces and corner surfaces 13. The overlying portions of the at least one dielectric material layer 20 within each semiconductor chip 160 includes a full chip metal interconnect structure region 22 and a peripheral dielectric portion 124. Each full chip semiconductor portion 10 is a portion of the semiconductor substrate 10L that includes a complete set of semiconductor devices designed for a fully functional semiconductor chip. Each full chip semiconductor portion 10 can have vertical semiconductor surfaces located within the same vertical planes as the vertical surfaces of the overlying portion of the at least one dielectric material layer 20 which are parallel to the two sets of parallel lines that define the grid pattern. The vertical semiconductor surfaces adjoin one another at vertical edges. The horizontal cross-sectional shape of each full chip semiconductor portion 10 can be rectangular.

Partial semiconductor chips 161 can also be formed from peripheral portions of the stack of the semiconductor layer 10L and the at least one dielectric material layer 20. Each partial semiconductor chips 161 includes a partial chip semiconductor portion 11 and a partial chip metal interconnect structure region 13. Each partial chip semiconductor region 11 is a portion of the at least one dielectric material layer 20 that includes an incomplete set of semiconductor devices that does not provide full functionality of a semiconductor chip.

Each semiconductor chip 160 includes a semiconductor substrate which is the full chip semiconductor portion 10, and further includes at least one dielectric material layer which is the combination of a full chip metal interconnect structure region 22 and a peripheral dielectric portion 124. The at least one dielectric material layer (22, 124) within the semiconductor chip 160 embeds metal interconnect structures. The at least one dielectric material layer (22, 124) two pairs of parallel vertical surfaces that are formed by dicing, and corner surfaces 13 that are not parallel to the pairs of parallel vertical surfaces and adjoin the pairs of parallel vertical surfaces.

Within each semiconductor chip 160, each full chip semiconductor portion 10 has pairs of vertical semiconductor surfaces located within the same vertical planes as the pairs of parallel vertical surfaces of the at least one dielectric material layer (22, 124). The vertical semiconductor surfaces adjoin one another at vertical edges. In one embodiment, each semiconductor chip 160 can include four vertical edges at which the vertical semiconductor surfaces adjoin one another.

In one embodiment, the corner surfaces 13 can be planar vertical surfaces that are not parallel to lines connecting the vertices of the grid pattern. In one embodiment, the corner surfaces can be convex vertical surfaces.

Figure 6A:
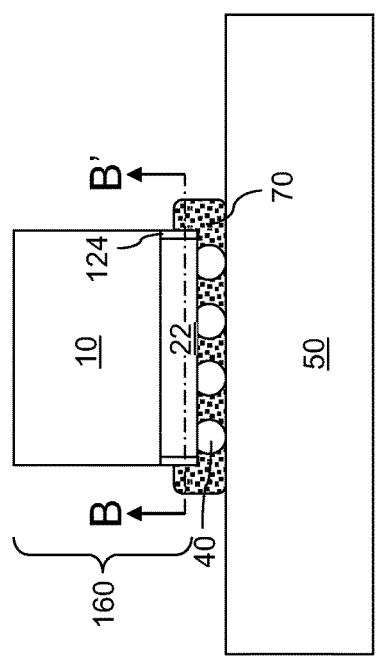
FIG. 6A is a vertical cross-sectional view of an exemplary bonded structure employing a singulated semiconductor chip, a bonding substrate, an array of solder balls, and an underfill material according to an embodiment of the present disclosure.
Figure 6C:
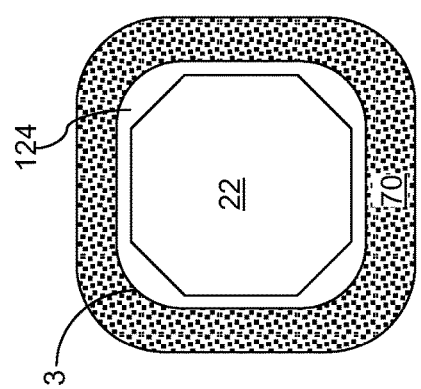
FIG. 6C is a top-down view of a variation of the exemplary bonded structure.
Figure 6B:
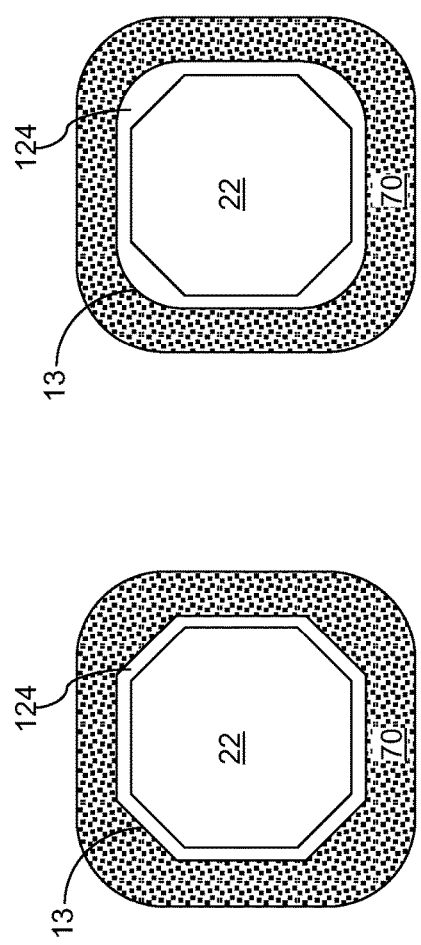
FIG. 6B is a top-down view of the exemplary bonded structure of FIG. 6A.

Referring to FIGS. 6A, 6B, and 6C, one or more of the semiconductor chips 160 as singulated by dicing can be bonded to a bonding substrate 50. As used herein, a bonding substrate refers to any substrate to which a semiconductor chip can be bonded, and can be, for example, an organic packaging substrate, a ceramic packaging substrate, another semiconductor chip, or a transposer. The bonding substrate 50 is provided with an array of second metal pads (not shown), which is located on the top surface of the bonding substrate and having the same pitch as the array of first metal pads (not shown) to which the solder balls 40 are bonded.

At least one of the plurality of semiconductor chips 160 formed by dicing can be bonded with the bonding substrate 50 with an underfill material 70 between the at least one diced semiconductor chip 160 and the bonding substrate 50. The underfill material 70 contacts corner surfaces 13 on each of the at least one of the plurality of semiconductor chips 160. In this case, the solder balls 40 are bonded to the bonding substrate 50 through the array of second metal pads. In one embodiment, an underfill material 70 may be applied to at least one semiconductor chip 160 prior to bonding. In another embodiment, an underfill material 70 may be applied to the bonding substrate 50 prior to bonding. In yet another embodiment, an underfill material 70 may be applied to a bonded structure including at least one semiconductor chip 160, the bonding substrate 50, and at least one array of solder balls 40 after bonding. In this case, the underfill material 70 can be injected into the space between the solder balls 40 within each array of solder balls 40. In one embodiment, the underfill material 70 can be in contact with the pairs of parallel vertical surfaces and the corner surfaces 13.

The semiconductor chip 160 bonded to the bonding substrate 50 includes pairs of parallel sidewalls that laterally adjoin the corner surfaces 13 and contact the underfill material 70. In one embodiment, the corner surfaces 13 are planar vertical surfaces. In another embodiment, the corner surfaces 13 are convex vertical surfaces.

The presence of corner surfaces 13 increases the angle between two pairs of vertical sidewalls of each peripheral dielectric portion 240. Specifically, the angle between two pairs of vertical sidewalls of each peripheral dielectric portion 240 is 90 degrees in the absence of corner surfaces 13, which is the configuration provided in prior art structures. However, the angle between adjoining sidewalls of a peripheral dielectric portion 240 can be in a range from 120 degrees to 150 degrees, and in some embodiments about 135 degrees, in embodiments in which four planar corner surfaces 13 are employed. The obtuse angle between adjoining sidewalls of the peripheral dielectric portion 240 reduces the mechanical stress applied to the semiconductor chip 160 during, and after, the bonding step. In embodiments in which four curved corner surfaces are employed, the outer surfaces of the peripheral dielectric portion does not include any point with a defined angle, thereby reducing the mechanical stress applied to the semiconductor chip 160 during, and after, the bonding step. Thus, the structures of embodiments of the present disclosure can be more stress-resistant than prior art diced semiconductor chips having corners with angles not exceeding 90 degrees.

The peripheral dielectric portion 124 in the corner of each die semiconductor chip 160 can have various shapes. For example, the peripheral dielectric portion 124 may have a 45 degree truncation at a corner, or may have a rounded corner. The shape of the peripheral dielectric portion 124 may be independent of the structural shape of the semiconductor chip 160.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method of manufacturing a semiconductor structure, said method comprising:
    forming at least one dielectric material layer on a semiconductor substrate, wherein said at least one dielectric material layer comprises:
        a plurality of metal interconnect structures, wherein a topmost surface of said metal interconnect structures and a topmost surface of said at least one dielectric material layer are coplanar; and
        a plurality of inter-chip dielectric regions, wherein said inter-chip dielectric regions are located between said metal interconnect structures,
    wherein each of said plurality of metal interconnect structures and an underlying portion of said semiconductor substrate form a semiconductor chip core, such that a plurality of semiconductor chip cores are formed on said semiconductor substrate, wherein said plurality of semiconductor chip cores are separated by an inter-chip dielectric region, and wherein each of said plurality of semiconductor chip cores is arranged in a grid pattern;
    forming an array of solder balls overlying each metal interconnect structure present within said semiconductor chip core;
    removing, after forming said array of solder balls, central portions of each of said inter-chip dielectric regions by laser irradiation to form grooves that extend entirely through said at least one dielectric layer and partially into said underlying semiconductor substrate, wherein said removing central portions of each of said inter-chip dielectric regions provides peripheral dielectric portions that laterally surround each of said plurality of metal interconnect structures, wherein said peripheral dielectric portions do not contact any of said array of solder balls, and wherein each of said peripheral dielectric portions comprises a bottommost planar surface that is in direct contact with an uppermost surface of said underlying portion of said semiconductor substrate and vertical outermost sidewalls that are parallel;

forming corner surfaces of said plurality of semiconductor chip cores around vertices of said grid pattern comprising:

widening said grooves at each vertex such that the vertical sidewalls of the metal interconnect structures are not exposed, wherein each corner surface is not parallel to any of a first set of parallel lines and a second set of parallel lines; and providing a non-linear path that deviates from a line within said two sets of parallel lines by adding additional segments around vertices of the grid pattern, wherein said non-linear path comprises a spiral pattern; and dicing said semiconductor substrate along said grooves to form a plurality of semiconductor chips, wherein said dicing is performed separately from groove formation.

2. The method of claim 1, wherein said corner surfaces are planar vertical surfaces that are not parallel to lines connecting said vertices of said grid pattern.

3. The method of claim 2, wherein remaining portions of said at least one dielectric material layer within one of said plurality of semiconductor chips have an octagonal horizontal cross-sectional shape after said forming of said corner surfaces.

4. The method of claim 1, wherein said corner surfaces are convex vertical surfaces.

5. The method of claim 4, wherein remaining portions of said at least one dielectric material layer within one of said plurality of semiconductor chips have a cross-sectional shape of a rounded rectangle after said forming of said corner surfaces.

6. The method of claim 1, wherein said grid pattern is defined by intersecting points of two sets of parallel lines, and said vertices are said intersecting points.

7. The method of claim 6, wherein said inter-chip regions are located on said two sets of parallel lines.

8. The method of claim 1, wherein each of said plurality of semiconductor chips includes a portion of said at least one dielectric material layer, said portion having vertical surfaces and a subset of said corner surfaces.

9. The method of claim 8, wherein each of said plurality of semiconductor chips further comprises a portion of said semiconductor substrate that has vertical semiconductor surfaces located within vertical planes of said vertical surface of said portion of said at least one dielectric material layer, wherein said vertical semiconductor surfaces adjoin one another at vertical edges.

10. The method of claim 1, further comprising bonding a semiconductor chip among said plurality of semiconductor chips with a bonding substrate with an underfill material between said semiconductor chip and said bonding substrate, wherein said underfill material contacts corner surfaces on said semiconductor chip.

11. The method of claim 10, wherein said semiconductor chip comprises pairs of parallel sidewalls that laterally adjoin said corner surfaces and contact said underfill material.

12. The method of claim 1, wherein each of said plurality of metal interconnect structures comprises outermost vertical sidewalls that contact an innermost vertical sidewall of said inter-chip dielectric regions.

13. The method of claim 12, wherein each of said plurality of metal interconnect structures extends across the entire topmost surface of each of said plurality of semiconductor chip core.

* * * * *